US009679917B2

(12) United States Patent
Donaton et al.

(10) Patent No.: US 9,679,917 B2
(45) Date of Patent: Jun. 13, 2017

(54) SEMICONDUCTOR STRUCTURES WITH DEEP TRENCH CAPACITOR AND METHODS OF MANUFACTURE

(71) Applicant: INTERNATIONAL BUSINESS MACHINES CORPORATION, Armonk, NY (US)

(72) Inventors: Ricardo A. Donaton, Cortlandt Manor, NY (US); Babar A. Khan, Ossining, NY (US); Xinhui Wang, Poughkeepsie, NY (US); Deepal Wehella-Gamage, Newburgh, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 49 days.

(21) Appl. No.: 14/580,390

(22) Filed: Dec. 23, 2014

(65) Prior Publication Data

US 2016/0181253 A1 Jun. 23, 2016

(51) Int. Cl.
*H01L 21/20* (2006.01)
*H01L 27/12* (2006.01)
*H01L 27/108* (2006.01)

(52) U.S. Cl.
CPC ...... *H01L 27/1211* (2013.01); *H01L 27/1087* (2013.01); *H01L 27/10826* (2013.01);
(Continued)

(58) Field of Classification Search
CPC ................. H01L 21/84; H01L 27/1087; H01L 29/66181; H01L 29/94; H01L 21/20;
(Continued)

(56) References Cited

U.S. PATENT DOCUMENTS 6,657,276 B1 12/2003 Karlsson et al.
6,764,884 B1 7/2004 Yu et al.
(Continued)

OTHER PUBLICATIONS

Office Action in the related U.S. Appl. No. 14/573,632 dated May 26, 2016, 11 pages.
(Continued)

*Primary Examiner* — Alexander Ghyka
*Assistant Examiner* — Aboulfattah Mustapha
(74) *Attorney, Agent, or Firm* — Steven Myers; Andrew M. Calderon; Roberts Mlotkowski Safran, Cole & Calderon, P.C.

(57) ABSTRACT

An integrated FinFET and deep trench capacitor structure and methods of manufacture are provided. The method includes forming deep trench capacitor structures in a silicon on insulator (SOI) wafer. The method further includes forming a plurality of composite fin structures from a semiconductor material of the SOI wafer and conductive material of the deep trench capacitor structures. The method further includes forming a liner over the deep trench capacitor structures including the conductive material of the deep trench capacitor structures. The method further includes forming replacement gate structures with the liner over the deep trench capacitor structures protecting the conductive material during deposition and etching processes.

20 Claims, 5 Drawing Sheets

(52) U.S. Cl.
CPC .. *H01L 27/10832* (2013.01); *H01L 27/10867* (2013.01); *H01L 27/10879* (2013.01)

(58) Field of Classification Search
CPC . H01L 29/945; H01L 27/1203; H01L 21/845; H01L 27/0733; H01L 27/1211; H01L 28/40; H01L 29/04; H01L 27/10879; G06F 17/5068; G06F 17/5072
USPC ........ 438/243, 247, 386, 389; 257/296, 301, 257/E21.09, E27.084, E21.646, E29.345
See application file for complete search history.

(56) References Cited

U.S. PATENT DOCUMENTS

| | | |
|---|---|---|
| 7,118,987 B2 | 10/2006 | Fu et al. |
| 7,148,525 B2 | 12/2006 | Mouli |
| 7,998,832 B2 | 8/2011 | Carter et al. |
| 8,766,355 B2 | 7/2014 | Lee et al. |
| 8,790,991 B2 | 7/2014 | Cummings et al. |
| 2004/0033661 A1 | 2/2004 | Yeo et al. |
| 2009/0184356 A1 | 7/2009 | Brodsky et al. |
| 2011/0175152 A1* | 7/2011 | Booth, Jr. ............. H01L 21/845 257/306 |
| 2011/0260263 A1 | 10/2011 | Carter et al. |
| 2012/0104547 A1 | 5/2012 | Ervin et al. |
| 2012/0187523 A1 | 7/2012 | Cummings et al. |
| 2012/0223399 A1 | 9/2012 | Carter et al. |
| 2013/0099229 A1 | 4/2013 | Wakana et al. |
| 2013/0320422 A1 | 12/2013 | Chang et al. |
| 2013/0320423 A1* | 12/2013 | Beaudoin .......... H01L 27/10826 257/301 |
| 2014/0070294 A1 | 3/2014 | Faltermeier et al. |
| 2014/0084372 A1 | 3/2014 | Doris et al. |

OTHER PUBLICATIONS

Final Office Action in related U.S. Appl. No. 14/573,632 dated Nov. 3, 2016, 15 pages.

* cited by examiner

SEMICONDUCTOR STRUCTURES WITH DEEP TRENCH CAPACITOR AND METHODS OF MANUFACTURE

FIELD OF THE INVENTION

The invention relates to semiconductor structures and methods of manufacture and, more particularly, to an integrated FinFET and deep trench capacitor structure and methods of manufacture.

BACKGROUND

FinFETs are three dimensional structures which provide excellent scalability. For example, FinFETs rise above the planar substrate, giving them more effective gate width for the same substrate footprint than conventional gate structures. Also, by wrapping the gate around the channel, the FET is fully depleted, so that little current is allowed to leak through the body when the device is in the off state, i.e., thereby providing low gate leakage current. This provides superior performance characteristics, e.g., high on currents due to the larger effective gate width, lower off currents due to the full depletion and less threshold voltage variations due to lower channel doping, resulting in improved switching speeds and power.

FinFETs can be fabricated using, for example, silicon on insulator (SOI) substrates. In SOI technologies, FinFETs can be used with many other devices and structures, and can be fabricated using CMOS technologies, e.g., lithography, etching and deposition methods. However because of the three dimensional structure, integration with other devices and/or structures are difficult and quite challenging. For example, it is a challenge to fabricate deep trench capacitors (eDRAM) with current FinFET fabrication processes.

SUMMARY

In an aspect of the invention, a method comprises forming deep trench capacitor structures in a silicon on insulator (SOI) wafer. The method further comprises forming a plurality of composite fin structures from a semiconductor material of the SOI wafer and conductive material of the deep trench capacitor structures. The method further comprises forming a liner over the deep trench capacitor structures including the conductive material of the deep trench capacitor structures. The method further comprises forming replacement gate structures with the liner over the deep trench capacitor structures protecting the conductive material during deposition and etching processes.

In an aspect of the invention, a method of forming a deep trench capacitor and a FinFET comprises: forming one or more deep trench capacitors from a surface of a semiconductor material of an semiconductor on insulator (SOI) substrate; patterning semiconductor material and the one or more deep trench capacitors to form composite fins; segmenting the composite fins to create a plurality of composite fin structures with conductive material of the one or more deep trench capacitors self-aligned and in contact with at least one end of the semiconductor material making a portion of the composite fin structures; forming a film of dielectric material over the conductive material of the one or more deep trench capacitors; annealing the film of dielectric material thereby hardening the film of dielectric material; and forming replacement gate structures over the plurality of composite fin structures while protecting the conductor material with the hardened film of dielectric material.

In an aspect of the invention, a structure comprises: a plurality of segmented composite fin structures comprising self-aligned semiconductor material and poly material of a deep trench capacitor; a hardened film of annealed dielectric material over recessed portions of conductive material of the deep trench capacitor; and replacement gate structures over portions of the composite fin structures comprising the semiconductor material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1A:
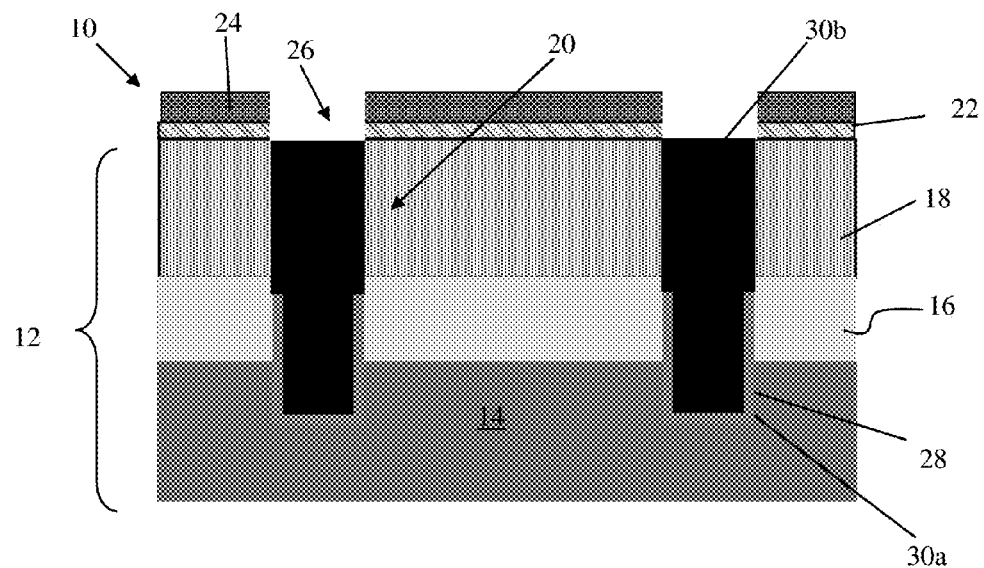
FIGS. 1a and 1b show different views of a structure and respective fabrication processes of forming deep trench capacitor structures, amongst other features, according to aspects of the invention.

The invention relates to semiconductor structures and methods of manufacture and, more particularly, to an integrated FinFET and deep trench (DT) capacitor structure and methods of manufacture. More specifically, the present invention comprises a method of manufacturing an integrated embedded DRAM (eDRAM) (e.g., deep trench capacitor structure) with an SOI (silicon-on-insulator) FinFET, with a deep trench first formation process. Advantageously, the deep trench first formation process provides a self aligning process for poly and fin contact.

In embodiments, the processes described herein include forming a DT capacitor structure (eDRAM) prior to fin formation. In embodiments, the DT capacitor structure is fully integrated with the fin formation process, which includes encapsulating the DT capacitor structure with a liner to prevent it from being attacked by subsequent gate and middle of the line (MOL) processes. In addition, the connection between the SOI fin and polysilicon material of the deep trench capacitor structure (eDRAM) can be formed in a self-aligned process.

More specifically, in the processes described herein, a DT process provides protection over the deep trench capacitor structure to withstand CMP as well as replacement gate, MOL and other processes. For example, in the formation processes described herein, an encapsulation film (e.g., annealed dielectric material liner) is formed after the deep trench is filled with capacitor material (e.g., poly material) and after fin formation. The annealed dielectric material liner will encapsulate or protect the capacitor material during subsequent CMP and wet etch processes. In additional embodiments, the DT capacitor structure (eDRAM) can be protected by a combination of oxide/nitride/Hi-K liner after fin formation. In embodiments, the oxide/nitride/Hi-K liner can be formed in a shallow trench formed in the capacitor material of the eDRAM, using conventional deposition processes. In this way, the processes described herein avoid many issues related to the formation of the fin structures after the DT capacitor structure is formed.

The structures described herein, e.g., DT capacitor structure and FinFETs, can be manufactured in a number of ways using a number of different tools. In general, though, the methodologies and tools are used to form structures with dimensions in the micrometer and nanometer scale. The methodologies, i.e., technologies, employed to manufacture the structures described herein have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1B:
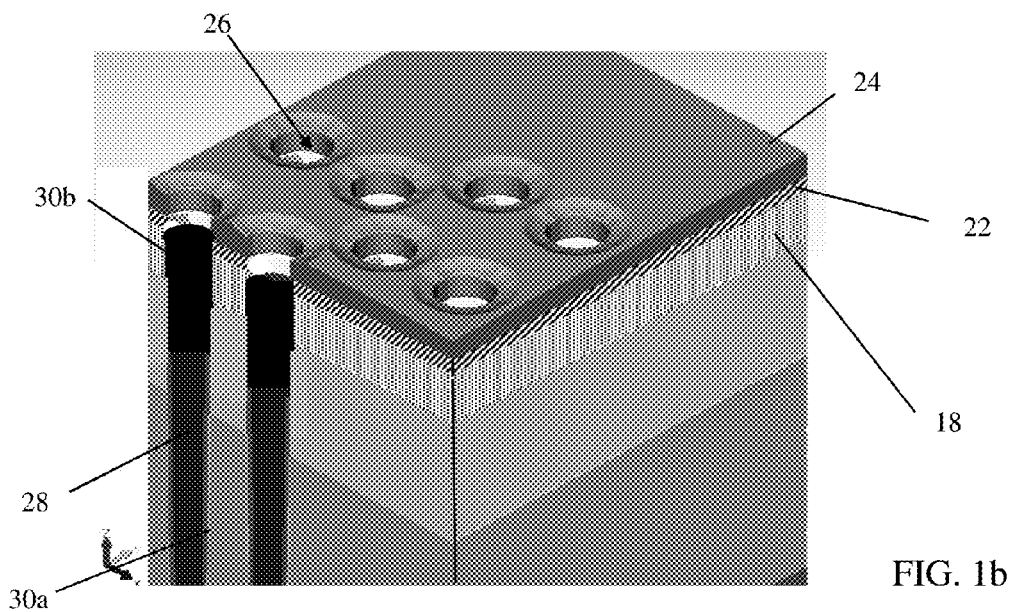

FIGS. 1a and 1b show a structure and respective fabrication processes of forming deep trench capacitor structures according to aspects of the invention. More specifically, FIG. 1a shows a cross sectional view of a substrate with a deep trench (DT) capacitor structure (eDRAM); whereas, FIG. 1b shows a perspective view of the structure of FIG. 1a and respective fabrication processes according to aspects of the invention.

In FIGS. 1a and 1b, the structure 10 includes a DT capacitor structure 20 formed in an SOI substrate 12. In embodiments, the DT capacitor structure 20 can be an eDRAM. The SOI substrate 12 is commercially available and can be fabricated using any conventional processes such as, for example, SiMOX, SMARTCUT or other known techniques. By way of illustrative example, the substrate 12 includes a buried oxide or other insulator layer 16 sandwiched between a wafer 14 and a semiconductor material 18. In embodiments, the semiconductor material 18 can be any semiconductor material such as, for example, Si, SiGe, Ge, GaAs, as well as other III/V or II/IV compound semiconductors or any combinations thereof.

In the manufacturing processes of forming the DT capacitor structure 20, an oxide material 22 and nitride material 24 are formed over the semiconductor layer 18, resulting in a hardmask. In embodiments, the nitride layer 24 can be deposited to a thickness of about 1000 Å; whereas, the oxide layer 22 can be deposited to a thickness of about 1 micron. A resist is formed over the hardmask, which is exposed to energy (light) to form a pattern. An etching process, e.g., reactive ion etching (RIE), is performed through the pattern to form deep trenches 26. In embodiments, the deep trenches 26 can extend into the BOX layer 16 and, in embodiments, into the underlying wafer 14. The resist can then be removed using conventional methods, e.g., oxygen ashing process.

Still referring to FIGS. 1a and 1b, the deep trenches 26 are filled with material, including a dielectric layer 28 followed by a TiN and poly fill, shown at reference numeral 30a. In embodiments, the dielectric layer 28 is a high-k dielectric liner, e.g., hafnium based material or other high-k dielectric material. In alternative embodiments, the dielectric layer 28 can be any insulator material (not limited to a high-k dielectric) deposited to a thickness of about 1 nm to about 3 nm; although other thicknesses are also contemplated by the present invention. A metal layer, e.g., TiN, is deposited on the dielectric material to a thickness of about 1 nm to about 3 nm; although other thicknesses are also contemplated by the present invention. The remaining portion of the deep trench 26 is then filled with polysilicon material. The materials 28 and 30a can be deposited by conventional deposition processes, e.g., atomic layer deposition (ALD). Any excess material can be removed from the surface by a RIE or CMP process, or a combination of both, for example.

As further shown in FIGS. 1a and 1b, the materials 28, 30a are recessed (e.g., etched back) to below an upper surface of the BOX 16. In embodiments, the materials 28, 30a can be recessed by a selective wet etch process and RIE process. After recessing, the upper portion of the deep trenches 26 are filled with a poly material 30b, which is in contact with semiconductor layer 18. The poly material 30b is then recessed (e.g., etched back) to an approximate height of the semiconductor material 18.

Figure 2:
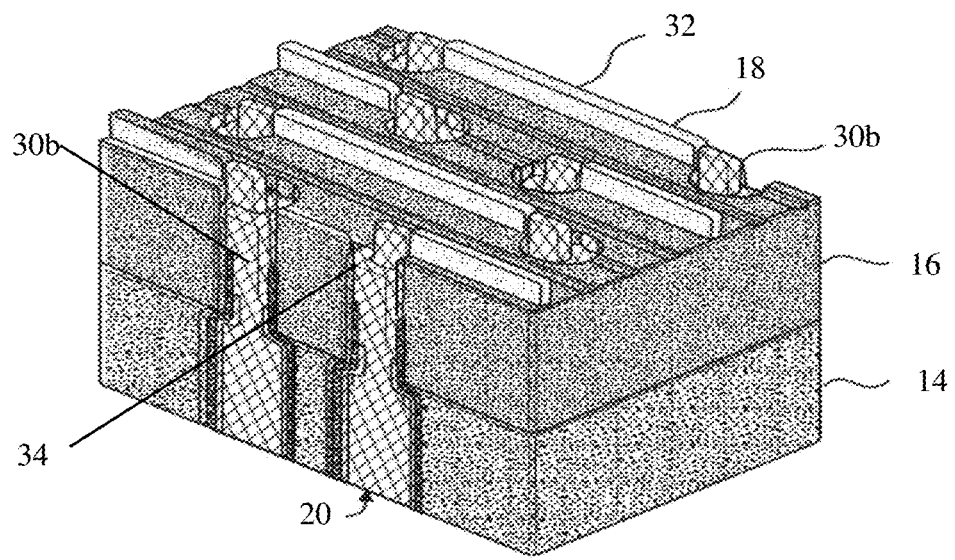
FIG. 2 shows a structure and respective fabrication processes of forming a composite fin structures according to aspects of the invention.

As shown in FIG. 2, the upper oxide layer (22) and nitride layer (24) of the hard mask are removed using conventional removal processes, e.g., wet or dry etching processes. After removal of these layers, composite fin structures 32 are formed using a sidewall image transfer (SIT) technique. In embodiments, the composite fin structures 32 comprise the semiconductor material 18 and the poly material 30b of the DT capacitor structure 20. By forming the fin structures 32 after the DT capacitor structure (eDRAM) formation, it is now possible to have the SOI fin and polysilicon material of the DT capacitor structure (eDRAM) self-aligned and in contact.

In the SIT technique, for example, a mandrel (e.g., oxide material) is formed on the semiconductor material 18 and the poly material 30b using conventional deposition, lithography and etching processes. For example, a resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. In embodiments, the spacer material can be a nitride film. The spacers can have a width which matches the dimensions of the narrow fin structures 32, for example. The mandrels are removed or stripped using a conventional etching process, selective to the mandrel material. An etching is then performed within the spacing of the spacers to form the sub-lithographic features, e.g., fin structures 32.

In embodiments, the etching process to form the composite fin structures 32 results in a shallow recess 34 in the unprotected poly material 30b of the DT capacitor structure 20. That is, conductive material (poly material 30b) adjacent to and which was used to form the composite fin structures 32 will have a recessed or etched back portion represented at reference numeral 34. This is due to the different etching rates between the poly material 30b and the semiconductor material 18. In embodiments, the shallow recess 34 can be approximately 30 nm to 60 nm below the surface of the BOX 16; although other dimensions are contemplated herein depending on the specific technologies. In embodiments, the recess 34 is of such a depth to ensure that no poly material extends above the surface of the BOX 16.

Still referring to FIG. 2, in embodiments, the fins can be cut or segmented to form a plurality of composite fin structures 32. For example, by using a conventional lithography and etching processes, e.g., wet etch process, portions of each fin can be removed to form a plurality of fin structures 32 along a length or width of the substrate 12. As shown in FIG. 2, the plurality of composite fin structures 32 include both the poly material 30b and the semiconductor material 18, self-aligned and in contact. In embodiments, the poly material 30b is provided at one or both ends of the plurality of composite fin structures 32, in contact with the semiconductor material 18.

Figure 3:
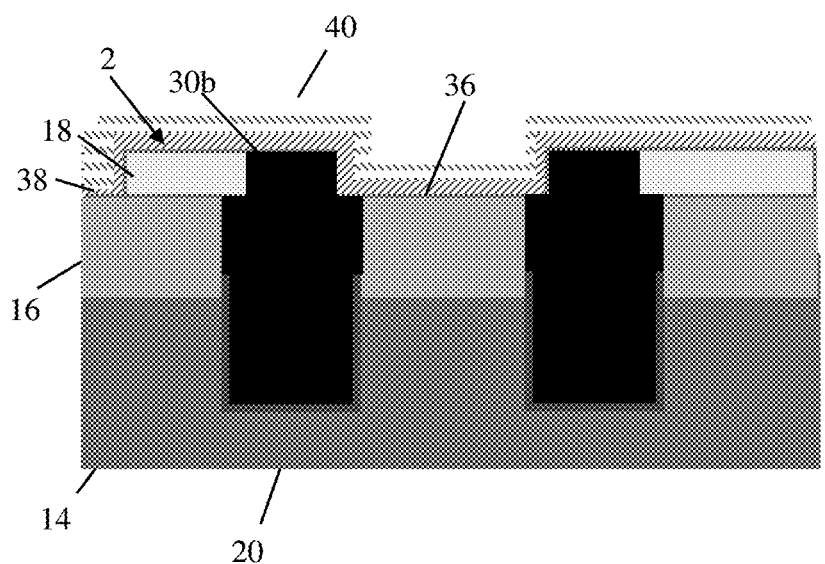
FIG. 3 shows a structure and respective fabrication processes of forming protective capping layers within a recessed portion of deep trenches and over the composite fin structures according to aspects of the invention.

Referring now to FIG. 3, a thin oxide material 36 is deposited on the composite fin structures 32 and exposed surface of the BOX 16. This thin oxide material 36 is also deposited within the shallow recess 34 in the poly material 30b of the DT capacitor structure 20. In embodiments, the thin oxide material 36 can be deposited using a conformal deposition process, e.g., molecular layer deposition (MLD), to a thickness of about 3 nm; although other dimensions are also contemplated by the present invention. A nitride material 38 is deposited over the oxide material 36 to a thickness of about 15 nm to 25 nm (depending on the technology node) using a conventional conformal deposition processes, e.g., MLD. The nitride thickness is sufficient to completely fill the space between logic fins (which are on a tighter pitch), while leaving a space between the fins in the eDRAM arrays which are on a wider pitch. In embodiments, the nitride material 38 is also deposited within the shallow recess 34.

As further shown in FIG. 3, the nitride material 38 is covered with a high-k dielectric liner 40. In embodiments, the high-k dielectric liner 40 can be a hafnium oxide or hafnium silicate. The high-k dielectric liner 40 can be deposited by a conformal deposition process, e.g., chemical vapor deposition (CVD), to a thickness of about 3 nm to 15 nm; although other dimensions are also contemplated by the present invention. The high-k dielectric liner 40 will protect the poly material 30b during subsequent MOL and replacement gate formation processes. In embodiments, the oxide material 36, nitride material 38 and/or high-k dielectric liner 40 are protective capping layers for the poly material 30b.

Figure 4:
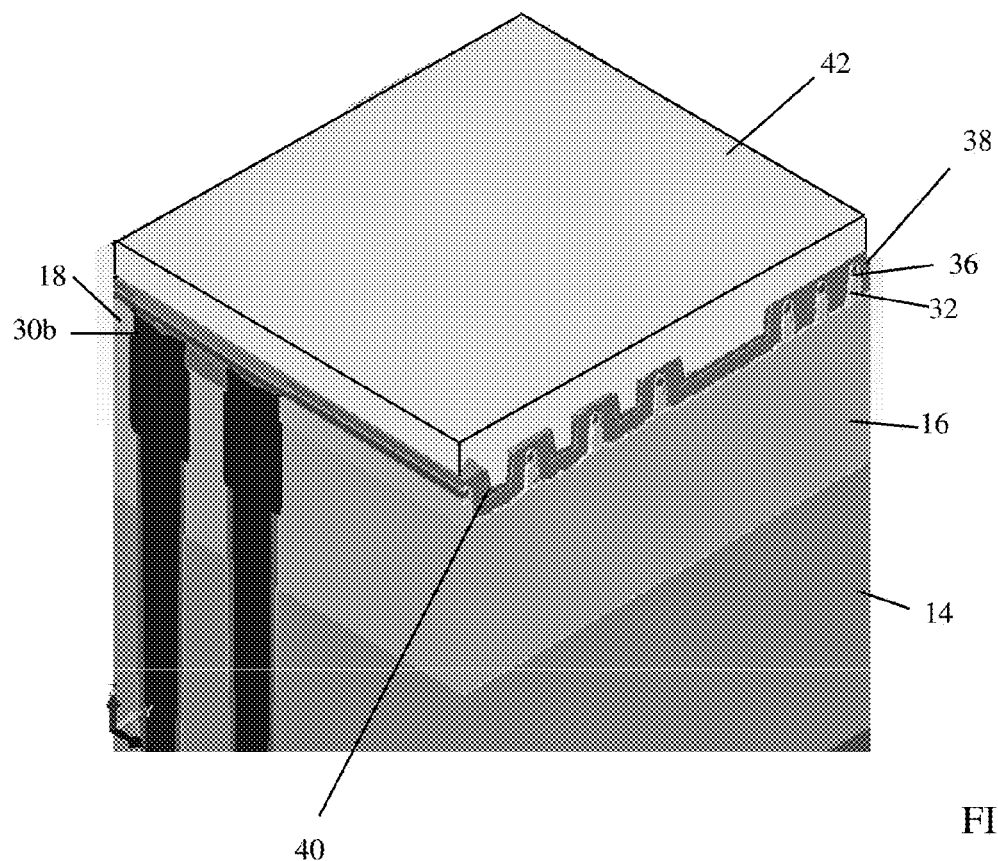
FIG. 4 shows a structure and respective fabrication processes of forming an oxide layer over the protective capping layers according to aspects of the invention.

In FIG. 4, an oxide material 42 is deposited on the high-k dielectric liner 40. In embodiments, the oxide material 42 can be deposited using a conformal deposition process, e.g., CVD. In alternate embodiments, the oxide material 42 can be deposited using a HDP process or MLD process.

Figure 5:
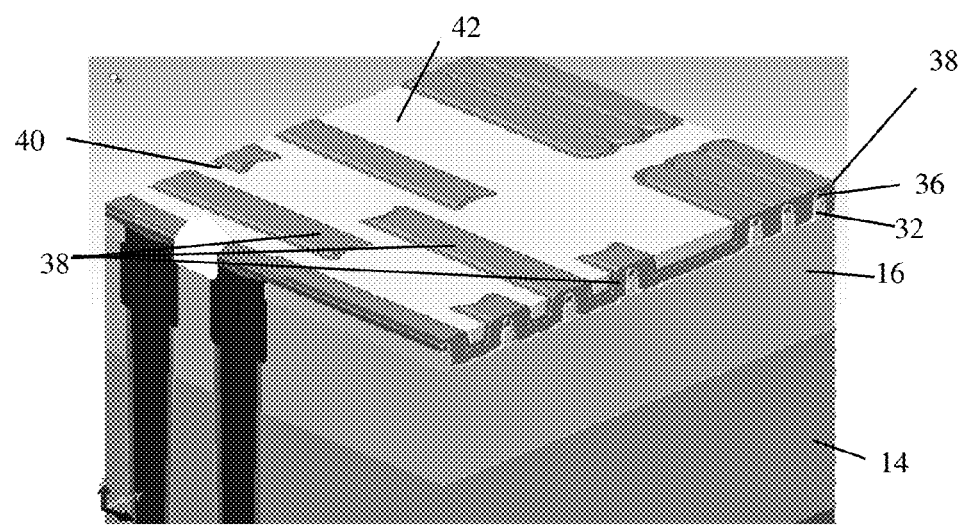
FIG. 5 shows a structure and respective fabrication processes of planarizing the oxide layer over the protective capping layers, partially removing a dielectric layer according to aspects of the invention.

As shown in FIG. 5, the deposition of the oxide material 42 is followed by a planarization process, e.g., CMP and wet etching processes. In embodiments, the CMP and wet etching processes will planarize the oxide material 42 to the underlying high-k dielectric liner 40 and, in embodiments, will remove portions thereof over the fin structures 32, thus exposing the underlying nitride material 38 over the composite fin structures 32. If the CMP stops on the high-k material, the high-k over the fins will be etched with hot phosphorous to expose the nitride over the fins. It should be understood by those of skill in the art that the high-k dielectric liner 40 will remain over the poly material 30b of the DT capacitor structure 20 in order to protect the poly material 30b during subsequent processing steps. In addition, it should be understood by those skilled in the arts that depositing dielectric layers on the fin and using CMP to planarize will fill the topology around the polysilicon fin in the DT to form a thick dielectric plug at the bottom of the polysilicon fin. In addition, it should be understood by those skilled in the arts that different combination of dielectric materials of different thicknesses, as well as wet and dry etching techniques can be used to reveal the active fins while protecting the deep trench.

Figure 6:
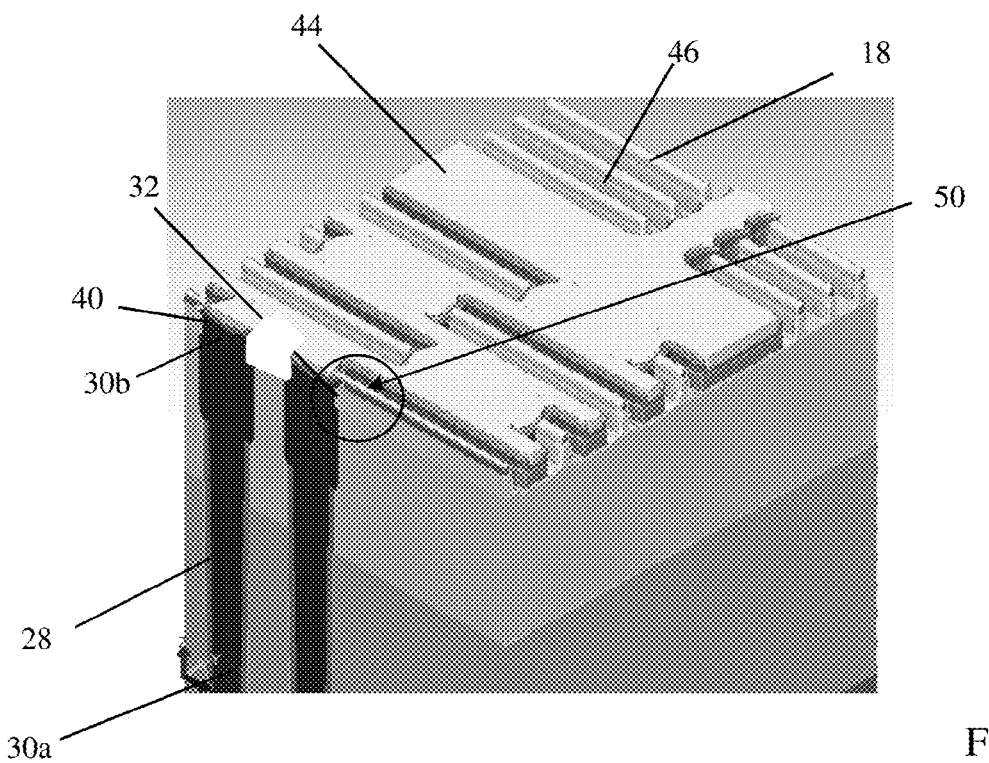
FIG. 6 shows a structure and respective fabrication processes of annealing or hardening a liner and exposing portions of the composite fin structures in preparation for gate replacement processes according to aspects of the invention.

As shown in FIG. 6, a thin oxide is then deposited and a mask 44 is then formed on the oxide material 42 and patterned to form a plurality of openings 46 aligned with selected composite fin structures 32 and more specifically portions of the composite fin structures 32 composed of the semiconductor material 18. In embodiments, the mask 44 will remain over the poly material 30b of the DT capacitor structures 20 during subsequent removal processes.

After the patterning of the mask 44, any remaining high-k layer remaining in the mask openings is etched selectively. The structure undergoes a thermal anneal process (represented by the plurality of arrows) to harden the high-k dielectric liner 40. In embodiments, the thermal anneal process can be performed at about 400° C. for about 15 minutes. More specifically, the high-k dielectric liner 40, in some embodiments, can be treated to harden and increase the density by baking (i.e., thermal annealing), irradiative annealing, plasma curing, E-beam curing, and/or UV curing the high-k dielectric liner 40. For example, the high-k dielectric liner 40 may be baked (i.e., thermally annealed) at a temperature of up to about 600° C. (e.g., about 300° C. to about 400° C.) for a period of time of up to about an hour (e.g., about 1 minute to about 1 hour).

Now that the high-k dielectric liner 40 is hardened, the nitride material and oxide material is removed through the openings of the mask 46, leaving the exposed semiconductor material 18 of the composite fin structure 32. More specifically, this etching process can be performed by a combination of wet (HP) and dry (RIE) processes, with the hardened high-k dielectric liner 40 protecting the poly material 30b that is in contact with the edges of semiconductor material 18 which forms the composite fin structures 32 as shown at reference numeral 50. As should be understood, due to the DT first formation, the semiconductor material 18 and the poly material 30b are self-aligned and remain in contact, protected from etching processes by the high-k dielectric liner 40. The remaining oxide material is removed by wet etching, which exposes the silicon fins 18 so that they are ready for gate dielectric deposition and the gate process. In addition, it should be understood by those skilled in the art that there are multiple combinations of dielectric layer materials and dielectric layer thicknesses, as well as the combination of wet and dry etching processes for revealing the active fins while covering the areas that need to be protected.

Figure 7A:
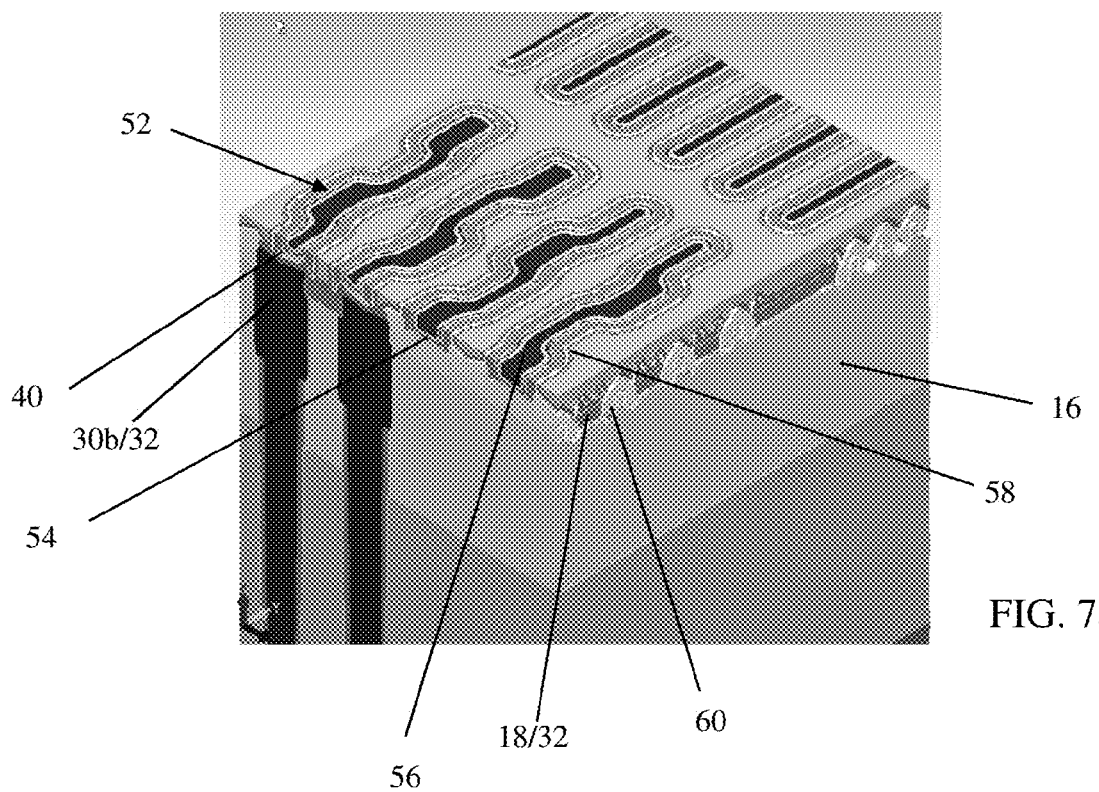
FIG. 7a shows a perspective view of a structure and respective fabrication processes of replacement gate formation according to aspects of the invention.
Figure 7B:
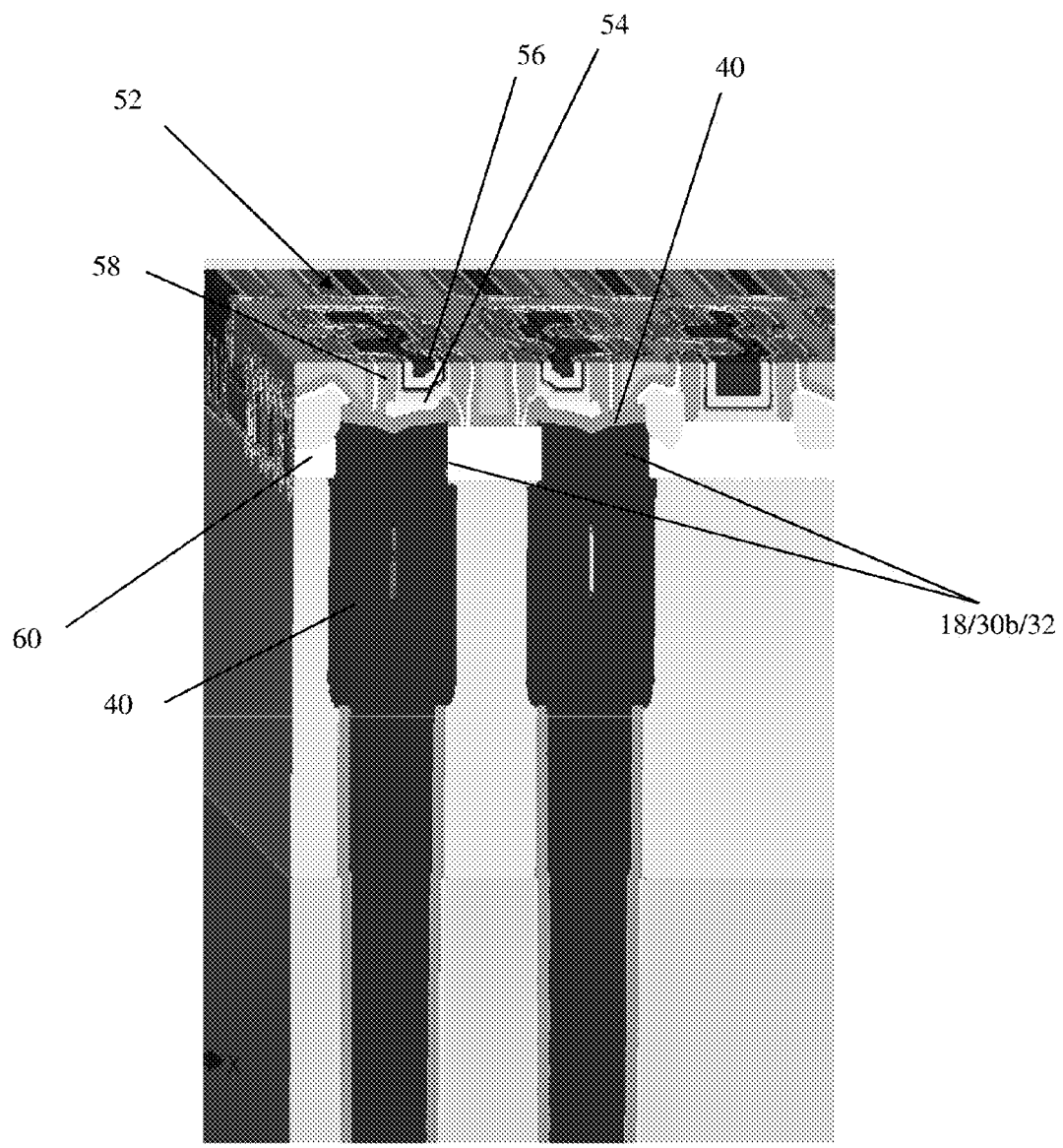
FIG. 7b shows a cross sectional view of the structure of FIG. 7a and respective fabrication processes according to aspects of the invention.

FIG. 7a shows a perspective view of the replacement gate structure and respective fabrication processes. FIG. 7b shows a cross sectional view of the structure of FIG. 7a and respective fabrication processes according to aspects of the invention. As shown representatively in FIGS. 7a and 7b, following the removal of the materials over the fin structures 32, a gate process can be performed to form a metal replacement gate as shown at reference numeral 52. As should be understood the annealed high-k dielectric liner 40 will be very resistant to the RIE and wet etch processes that are used to form the gate and spacer and will keep the poly material 30b within the deep trench fully encapsulated during the entire gate and spacer formation processes. In addition, it should be understood by those skilled in the arts that even if the high-k dielectric layer is not used, it will still be possible to protect the polysilicon in the DT from these gate processes if the dielectric plug that is formed around the polysilicon fin is thick (approximately 20 nm or more).

By way of more specific example, a gate dielectric material 54 is deposited on the fin structures 32 using a conventional gate dielectric deposition process. This is followed by deposition and patterning of amorphous silicon to form the gate structure. This is followed by the spacer formation process, e.g., spacer material such as nitride material 58. The process continues with a source-drain epitaxial growth and then the replacement gate process. In embodiments, the material forming the source and drain 60 can be doped Si or other semiconductor material. For example, the source region can be an N+ epi material; whereas, the drain region can be a P+ epi material. In the replacement gate process, the gate amorphous silicon is exposed by a CMP process and the amorphous silicon removed by an isotropic RIE process. This is followed by a deposition of a metal or metal alloy material(s) 56 engineered with certain work functions to form the gate, itself. The structure can then be planarized to remove any excessive gate material, followed by contact and anneal processes known to this of skill in the art.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming deep trench capacitor structures in a silicon on insulator (SOI) wafer;
   forming a plurality of composite fin structures from a semiconductor material of the SOI wafer and conductive material of the deep trench capacitor structures;
   forming a protective capping layer directly over the conductive material of the deep trench capacitor structures; and
   forming replacement gate structures with the liner over the deep trench capacitor structures protecting the conductive material during deposition and etching processes,
   wherein the protective capping layer further comprises an oxide material directly over a nitride material, the nitride material is directly over the liner, and the liner is directly over the conductive material of the deep trench capacitor structures.

2. The method of claim 1, wherein the conductive material of the deep trench capacitor structures and the semiconductor material of the SOI wafer are self-aligned for the plurality of composite fin structures.

3. The method of claim 1, wherein the forming of the protective capping layers comprises depositing the liner including a high k-dielectric material over the deep trench capacitor structures and annealing the high k-dielectric material.

4. The method of claim 3, wherein the annealing is provided subsequent to a mask opening process to remove protective capping material from selected ones of the plurality of composite fin structures.

5. The method of claim 3, wherein the high k-dielectric material is a hafnium based material.

6. The method of claim 3, wherein the conductive material is recessed in unprotected portions formed during the forming of the plurality of composite fin structures.

7. The method of claim 6, wherein the protective capping layer is formed within the recess of the conductive material about surfaces of the conductive material forming the plurality of composite fin structures.

8. The method of claim 7, further comprising etching back the conductive material of the deep trench capacitor structures to an approximate height of the semiconductor material of the SOI wafer, prior to forming of the plurality of composite fin structures.

9. The method of claim 8, further comprising:
   forming a first material over the plurality of composite fin structures;
   forming a second material over the first material;
   forming the high k-dielectric material on the second material; and
   removing the high k-dielectric material, the first material and the second material over semiconductor portions of the plurality of composite fin structures for the replacement gate structures to be formed on the semiconductor portions of the plurality of composite fin structures.

10. The method of claim 1, wherein the forming the deep trench capacitor structures comprises:
    etching a deep trench through the SOI wafer including the semiconductor material and a buried insulator layer;
    lining the deep trench with a dielectric material and a metal material;
    filling remaining portions of the deep trench with poly material;
    recessing the dielectric material, the metal material and the poly material to below a surface of the buried insulator material;
    filling the recess with the conductive material to above the buried insulator layer; and
    etching back the conductive material to an approximate height of the semiconductor material.

11. The method of claim 10, wherein the forming of the plurality of composite fin structures comprises patterning the semiconductor material of the SOI wafer and conductive material of the deep trench capacitor structures in a single etching process, which forms a recess in the conductive material about a portion of the fin comprising the conductive material.

12. A method of forming a deep trench capacitor and a FinFET, comprising:
    forming one or more deep trench capacitors from a surface of a semiconductor material of an semiconductor on insulator (SOI) substrate;
    patterning semiconductor material and the one or more deep trench capacitors to form composite fins;
    segmenting the composite fins to create a plurality of composite fin structures with conductive material of the one or more deep trench capacitors self-aligned and in contact with at least one end of the semiconductor material making a portion of the composite fin structures;
    forming a film of dielectric material over the conductive material of the one or more deep trench capacitors;
    annealing the film of dielectric material thereby hardening the film of dielectric material;
    forming replacement gate structures over the plurality of composite fin structures while protecting the conductor material with the hardened film of dielectric material; and
    providing protective capping materials which comprise an oxide material directly over a nitride material, the nitride material is directly over the film of dielectric material, and the film of dielectric material is directly over the conductive material of the one or more deep trench capacitors.

13. The method of claim 12, wherein the forming of the one or more deep trench capacitors comprises:
    forming a hardmask layer over the semiconductor layer;
    patterning the hardmask to form a plurality of openings;
    etching a deep trench through the openings and extending through an insulator layer underlying the semiconductor material;
    filling the deep trench with a plurality of materials including a dielectric liner and conductive material;
    recessing the plurality of materials to below a surface of the insulator layer;
    filling the recess with the poly material; and
    recessing of the poly material to a surface of the semiconductor material; and
    removing the hardmask.

14. The method of claim 13, wherein a recess is formed in the poly material during the patterning of the semiconductor material and the one or more deep trench capacitors to form the plurality of composite fin structures.

15. The method of claim 14, wherein the film of dielectric material is formed within the recess and about the plurality of composite fin structures.

16. The method of claim 15, wherein the protective capping materials are under the film of dielectric material to further protect the poly material during etching processes for the replacement gate structures.

17. The method of claim 16, wherein the dielectric material is a high-k dielectric material which remains over the poly material during forming of the replacement gate structures.

18. The method of claim 17, wherein the annealing of the film of dielectric material is performed after forming a mask layer with openings corresponding to portions of the plurality of composite fin structures devoid of the poly material.

19. The method of claim 18, wherein the mask layer is an oxide layer which is formed over a planarized surface of the protective capping materials which removes a portion of the high-k dielectric material corresponding with the openings.

20. A structure, comprising:
    a plurality of segmented composite fin structures comprising self-aligned semiconductor material and poly material of a deep trench capacitor;
    a hardened film of annealed dielectric material over recessed portions of conductive material of the deep trench capacitor;
    replacement gate structures over portions of the composite fin structures comprising the semiconductor material; and
    protective capping layers which comprise an oxide material directly over a nitride material, the nitride material is directly over the hardened film of anneal dielectric material, and the hardened film of anneal dielectric material is directly over the conductive material of the deep trench capacitor.

* * * * *